United States Patent [19]

Nelson

[11] Patent Number: 4,713,628
[45] Date of Patent: Dec. 15, 1987

[54] COMPENSATION AND BIASING OF WIDEBAND AMPLIFIERS

[75] Inventor: David A. Nelson, Ft. Collins, Colo.

[73] Assignee: Comlinear Corporation, Fort Collins, Colo.

[21] Appl. No.: 916,621

[22] Filed: Oct. 8, 1986

[51] Int. Cl.$^4$ .............................................. H03F 3/45
[52] U.S. Cl. ..................................... 330/254; 330/252; 330/261
[58] Field of Search ............... 330/252, 254, 255, 257, 330/259, 260, 261, 288

[56] References Cited

U.S. PATENT DOCUMENTS 4,502,020  2/1985  Nelson et al. ..................... 330/265

Primary Examiner—Gene Wan
Attorney, Agent, or Firm—William E. Hein

[57] ABSTRACT

Compensation for the effect of parasitic and stray impedance which is present at the inverting input of known current feedback wideband amplifiers is described. The compensation permits these amplifiers to operate at higher frequencies without degrading the gain flatness of the amplifier and also simplifies the circuitry required to maintain correct biasing.

8 Claims, 11 Drawing Figures

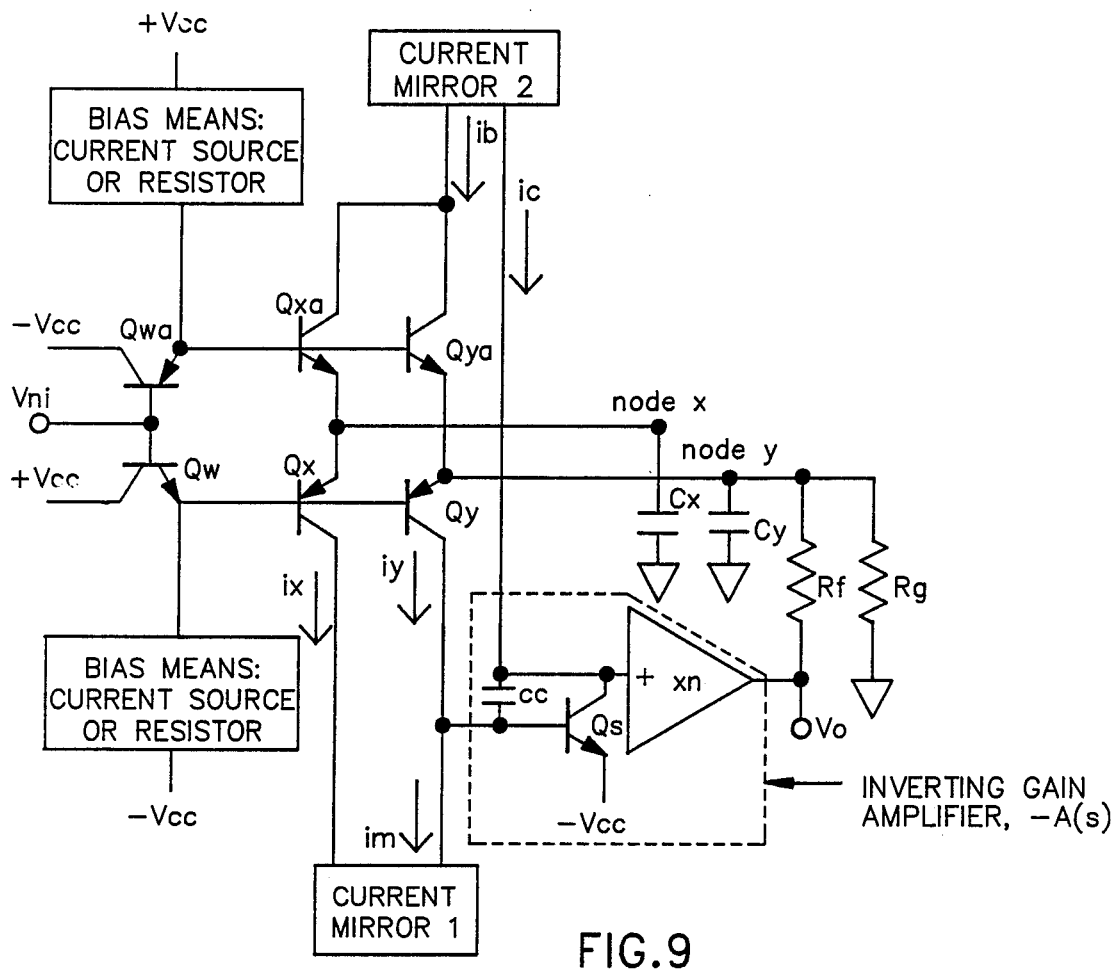
FIG. 9
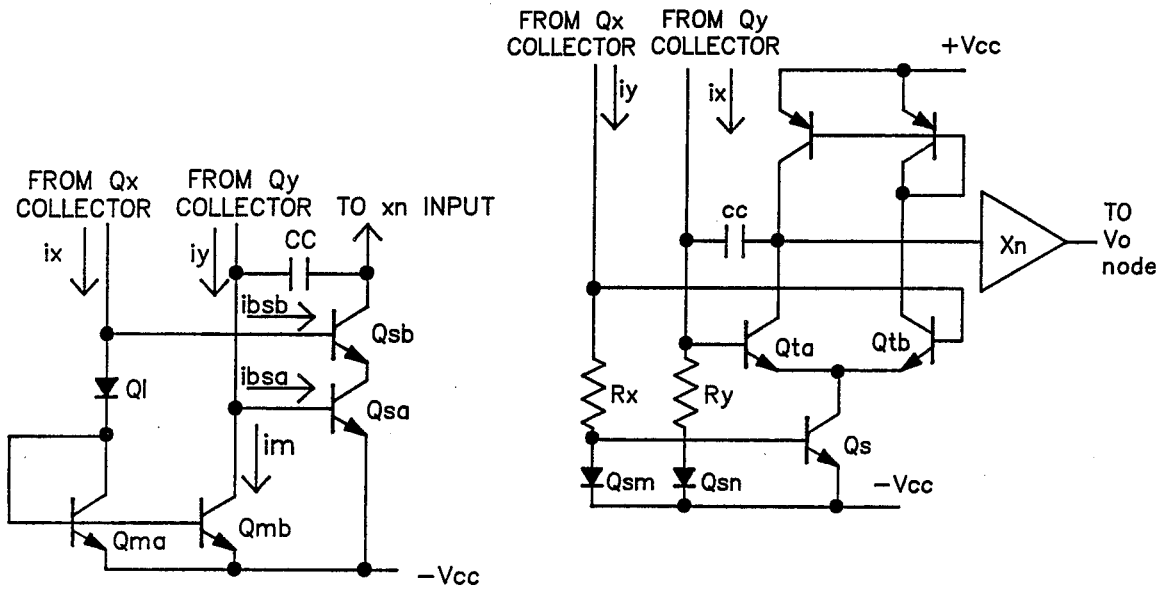
FIG. 10
FIG. 11

COMPENSATION AND BIASING OF WIDEBAND AMPLIFIERS

REFERENCE TO RELATED PATENTS

This application is related to the subject matter of U.S. Pat. Nos. 4,358,739 and 4,502,020. The subject matter thereof is incorporated herein by reference.

BACKGROUND AND SUMMARY OF THE INVENTION

This invention relates generally to the method of current feedback taught in the above-referenced related patents that are directed to wideband directcoupled transistor amplifiers. These prior art amplifiers are sensitive to stray package and printed circuit board impedances which are unavoidably present at their inverting inputs. In the noninverting gain configuration the presence of capacitance Cp, as illustrated in prior art FIGS. 1 and 2 and as an example of parasitic or stray impedance, will cause peaking in the frequency response. From FIG. 2, the forward gain transfer function becomes $vo(s)/vni(s) = (1+Rf/Rg)(1+sCpRp)/(1+Rf/A(s))$, where $Rp = RgRf/(Rg+Rf)$. The forward gain transfer function for the prior art amplifier of FIG. 1 is a similar expression. Due to the wide range of possible gain expressions $A(s)$, using the zero term to cancel a pole of gain expression $A(s)$ is not always possible. To minimize the frequency response peaking resulting from the zero term $(1+sCpRp)$, either CpRp could be made very small or the pole term $(1+Rf/A(s))$ could be made large in order to insure that the bandwidth of the amplifier is much less than the zero frequency. The first option of increasing the zero frequency is not always desirable or possible due to constraints on the value of resistance Rp or the type of circuit or layout which gives rise to capacitance Cp. The second option is of couse undesirable because the bandwidth of the amplifier must be reduced. A third compensation option which is commonly used is to place a capacitance Cf in parallel with resistance Rf to create a pole which cancels the zero term above. Unfortunately, secondary pole and zero contributions at higher frequencies are also created by capacitance Cf, which may cause other undesirable effects. In any case, this in not a good general solution because as resistance Rg is varied to set the gain, capacitance Cf must vary to keep the product RgCp approximately equal to the product RfCf. This is both difficult and expensive due to the very small and possibly complex nature of the stray impedance.

Embodiments of the present invention as illustrated in FIGS. 3–4 and 7–9 completely eliminate the troublesome zero term caused by stray impedance at the inverting input and, furthermore, simplify the bias control circuitry of some known prior art amplifiers. In addition, the embodiments of the present invention illustrated in FIGS. 10 and 11 serve to reduce the inverting input bias currents of the amplifiers of FIGS. 3–4 and 7–9.

DESCRIPTION OF THE DRAWINGS

FIG. 9 is a functional schematic representation of an embodiment of the wideband amplifier of the present invention as illustrated in FIG. 8 in which an additional current mirror gain stage is placed in parallel with the gain stage.

FIG. 10 is a schematic diagram of an enhancement to the circuits of FIGS. 8 and 9 which reduces the inverting input bias currents.

FIG. 11 is a schematic diagram of an enhancement to the circuit of FIG. 7 which also serves to reduce the inverting input bias currents.

DETAILED DESCRIPTION OF THE ILLUSTRATED EMBODIMENTS OF THE INVENTION

Figure 1:
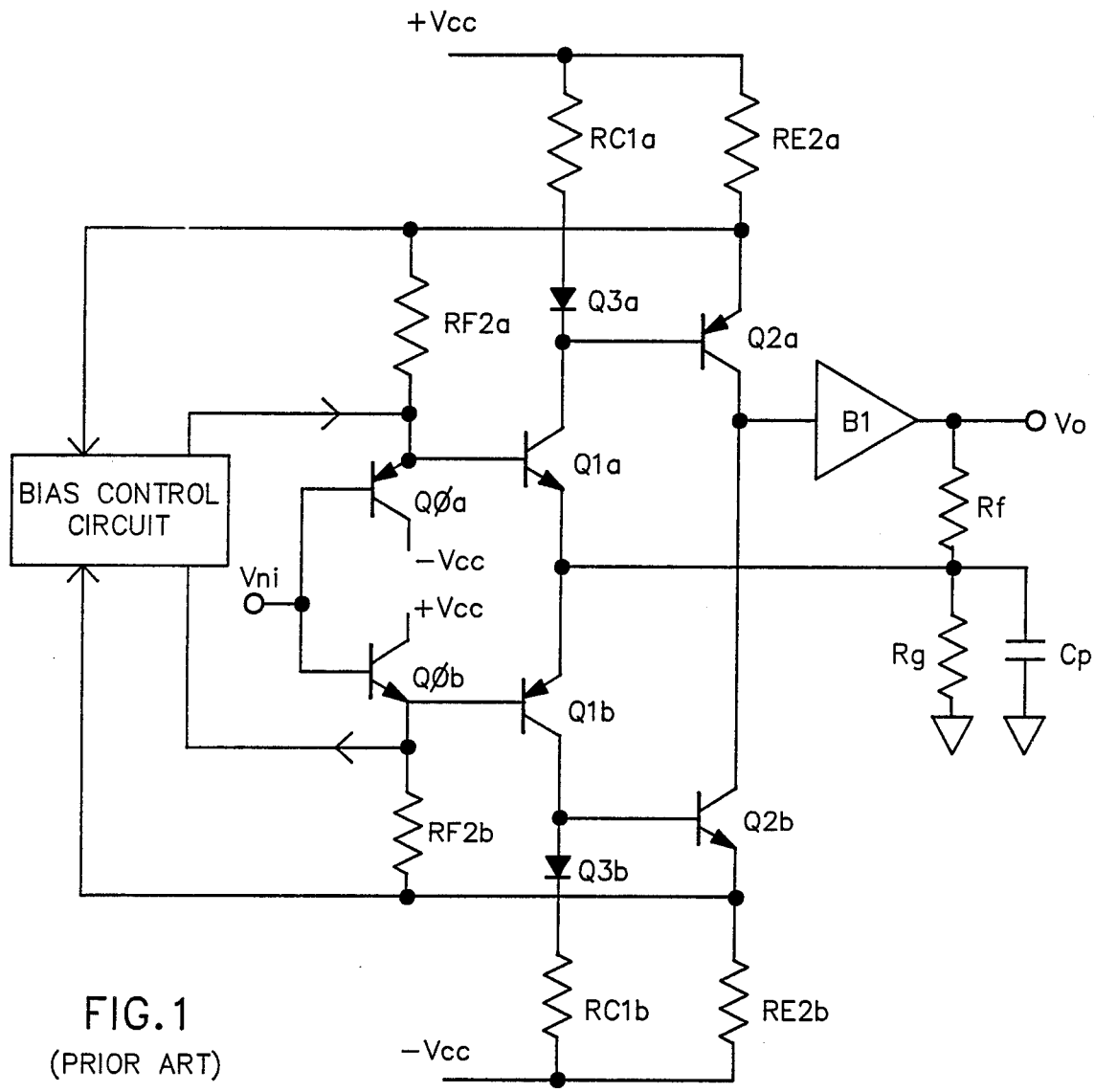
FIG. 1 is a functional schematic representation of a prior art wideband amplifier.
Figure 2:
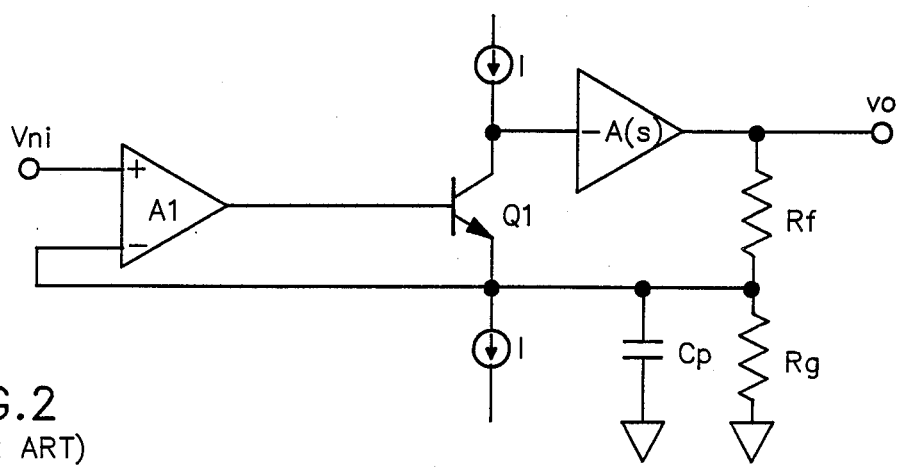
FIG. 2 is a functional schematic representation of another prior art wideband amplifier.
Figure 3:
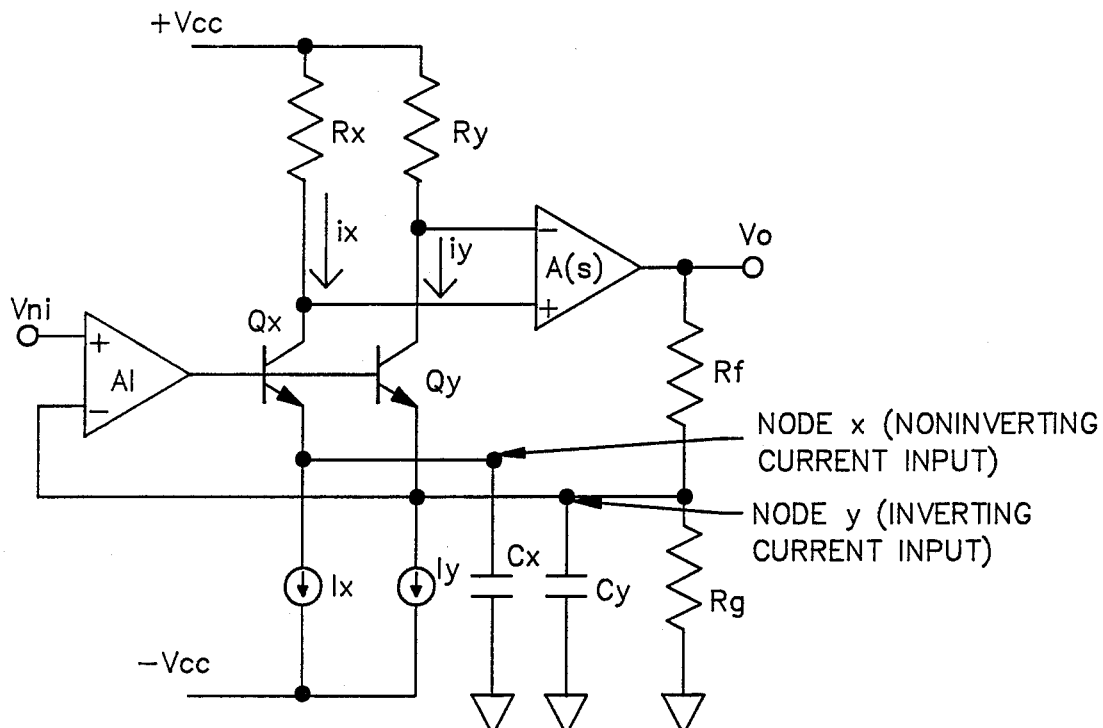
FIG. 3 is a functional schematic representation of the wideband amplifier of the present invention using a closed loop input stage and an internal voltage gain stage.

Referring now to FIG. 3, there is shown a wideband amplifier circuit in which the effect of stray capacitance Cy present at node y, the inverting (current) input, is cancelled. Amplifier A1 in combination with transistors Qx and Qy form an input buffer which causes the voltage at both the inverting current input terminals (nodes x and y) to be equal to the non-inverting input voltage vni. The capacitance Cx acts to cancel the effect of stray capacitance Cy when $CxRx = CyRy$ because voltage gain stage $A(s)$ acting with resistors Rx and Ry forms an amplifier which is sensitive to the difference between currents ix and iy. This can be shown through the following analysis. The collector currents of transistors Qx and Qy are given by the equations $ix = (vni)sCx + Ix$ and $iy = (vni)sCy + Iy + vni/Rg - (vo-vni)/Rf$. Also, output voltage $vo = -(ixRx - iyRy)A(s)$. Substituting, $vo = ((vni)s(CyRy - CxRx) + (IyRy - IxRx) + vni(Ry/Rg) - (vo-vni)(Ry/Rf))A(s)$. So when CxRx is equal to CyRy, the zero term is cancelled. When IxRx is equal to IyRy, the inverting input bias current is zero also. Now, since $A(s)$ is a general gain expression, the effect of resistance Ry could be incorporated within the expression $A(s)$, and the transfer function becomes $vo/vni = (1+Rf/Rg)/(1+Rf/A(s))$ as though no stray capacitance were present. Thus, this circuit can operate with wider bandwidth, without restrictions on the value of resistor Rg or gain, and without further compensation.

Normally, resistance Rx would be equal to resistance Ry and Ix would be equal to Iy. Typically, capacitances Cx and Cy represent a complex impedance composed of the distributed effects of capacitance, resistance, and inductance. Normally, the best way to duplicate this impedance is to duplicate the physical arrangement of node y at node x. This is done by bringing both nodes out of the amplifier package and duplicating the circuit board trace directly up to the point where resistors Rg and Rf attach at node y. Other conventional means of duplicating this impedance may also be used.

Figure 4:
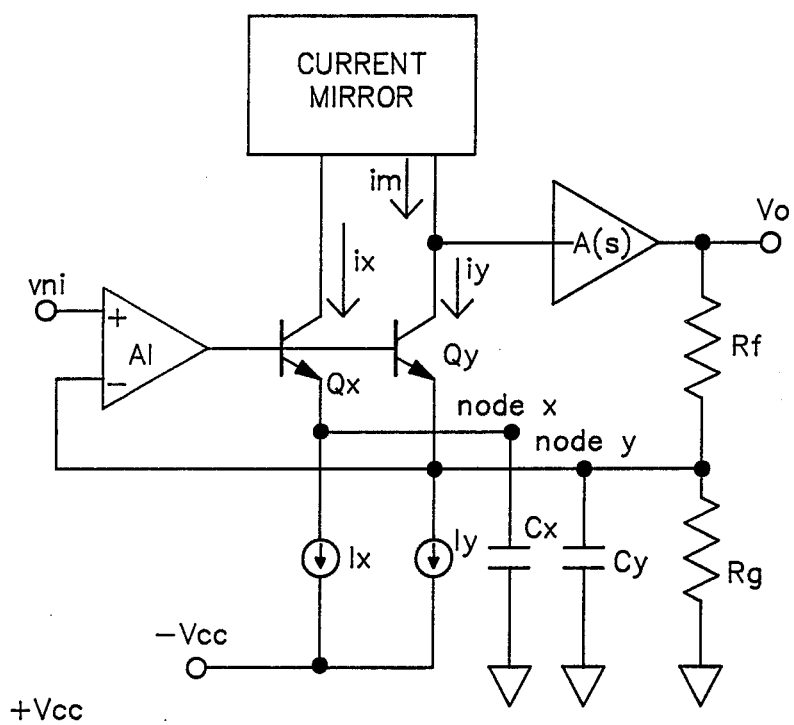
FIG. 4 is a functional schematic representation of the wideband amplifier of the present invention using a closed loop input stage and an internal current mirror with an inverting amplifier gain stage.
Figure 5:
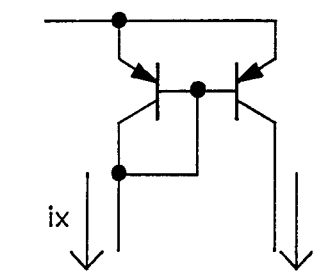
FIG. 5 is a schematic diagram of a current mirror that may be employed in the wideband amplifier circuit of FIG. 4.
Figure 6:
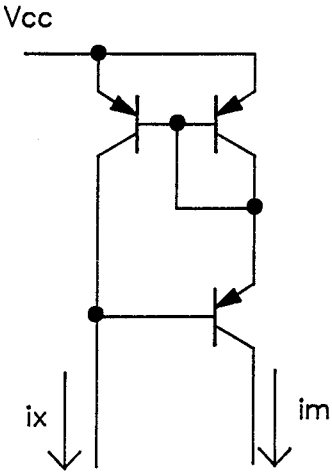
FIG. 6 is a schematic diagram of another current mirror that may be employed in the wideband amplifier circuit of FIG. 4.

Referring now to FIG. 4, there is shown an alternative embodiment of the wideband amplifier of FIG. 3 that functions to provide the same results. Resistors Rx and Ry and voltage gain block A(s) of FIG. 3 are replaced by a current mirror and inverting amplifier A(s). As explained above in connection with FIG. 3, the current mirror and inverting amplifier A(s) of FIG. 4 form an amplifier sensitive to the difference between currents ix and iy. The troublesome zero caused by stray capacitance Cy can be cancelled when capacitance Cx is equal to Cy(ix/im) with the current mirror gain (im/ix) set for im equal to iy. To minimize inverting input bias current, Ix=Iy(ix/im). Normally, since it is easier to make capacitance Cx equal to stray capacitance Cy than to set capacitance Cx equal to some known ratio of stray capacitance Cy, the current mirror gain will be 1. This simplifies the current mirror construction as well. Two examples of current mirror circuits are shown in FIGS. 5 and 6 as being representative of the many possible current mirror circuits that could be fabricated for use in the amplifier of FIG. 4.

Figure 7:
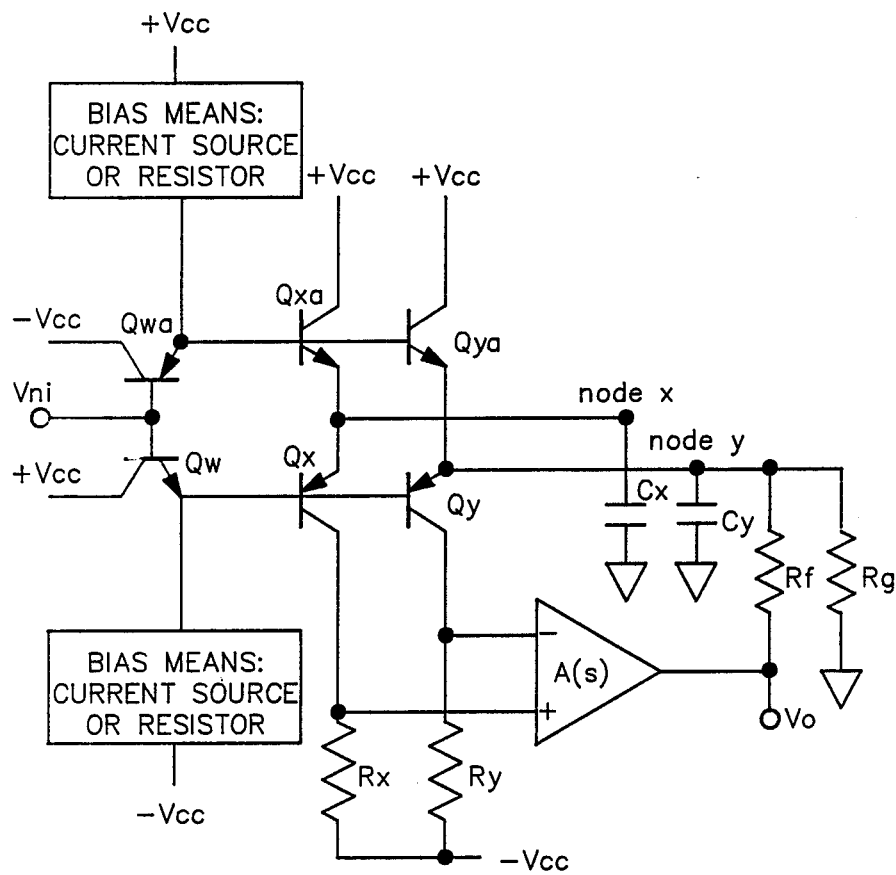
FIG. 7 is a functional schematic representation of an embodiment of the wideband amplifier of the present invention using a complementary open loop input stage and an internal voltage gain stage.
Figure 8:
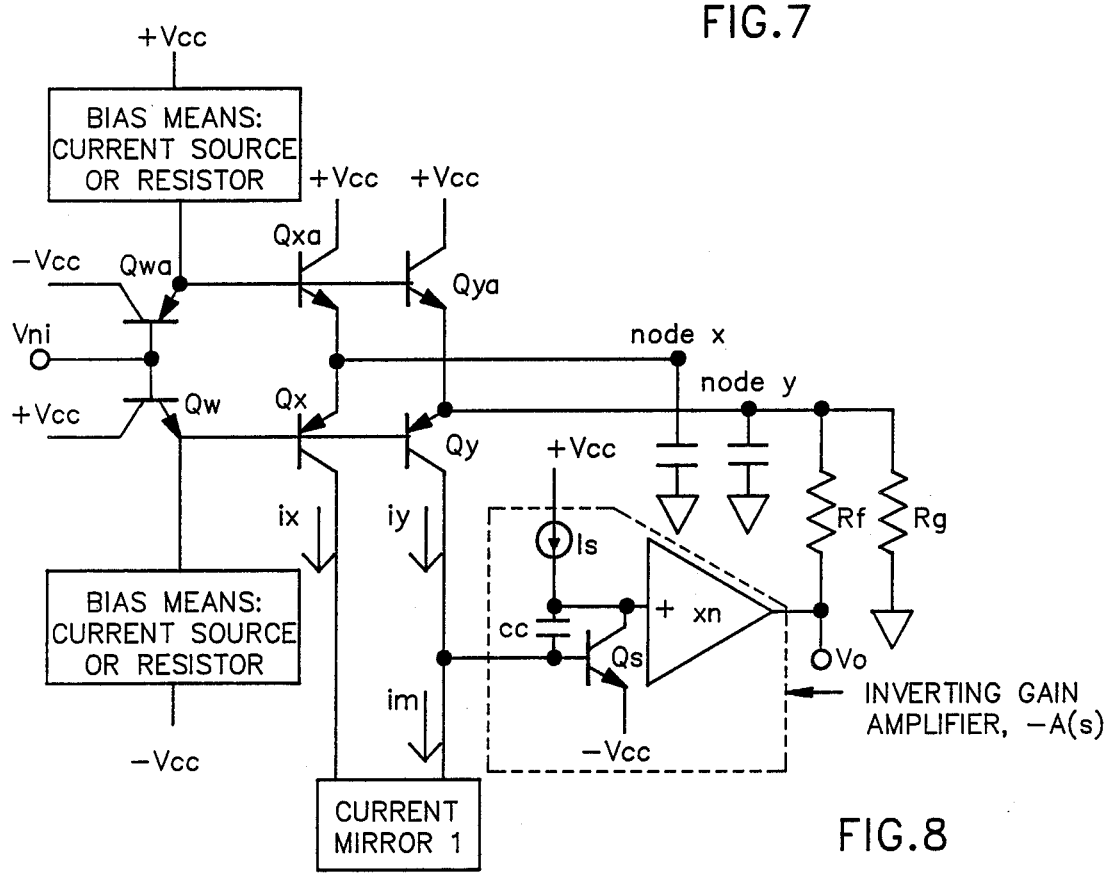
FIG. 8 is a functional schematic representation of an embodiment of the wideband amplifier of the present invention using a complementary open loop input stage and an internal current mirror with an inverting amplifier gain stage.

FIGS. 7-9 each illustrate a feedback amplifier circuit with means for eliminating the zero in the transfer function when the input buffer composed of six transistors (Qw, Qwa, Qx, Qxa, Qy, and Qya) replaces the input buffer comprising amplifier A1 and transistors Qx and Qy employed in the circuit of FIGS. 3 and 4. The ratio of the emitter areas of Qx to Qy, Qxa to Qya, and Qwa to Qw should normally be set to 1 to maintain equal DC bias currents for equal base-emitter voltages, although other ratios could be used. When this ratio is set to 1, the equations and analysis presented above in connection with the amplifier circuit of FIG. 3 also applies to FIG. 7, and the analysis of FIG. 4 applies to FIGS. 8 and 9. In FIGS. 8 and 9, the transfer function of the inverting amplifier formed by transistor Qs, capacitance cc, current source Is (or current mirror 2 of FIG. 9), and amplifier xn can be said to have a transfer function of −A(s), to facilitate analysis as described above in connection with the circuit of FIG. 4. Examples of two possible current mirror circuit configurations are shown in FIGS. 5 and 6. Similarly, current mirror 1 could be formed by replacing the PNP transistors and positive supply voltage +Vcc of FIGS. 5 and 6 with NPN transistors and negative supply voltage −Vcc. Of course, this same change from NPN or PNP to PNP or NPN devices, respectively, could be made in any of the illustrated embodiments of the present invention. MOS transistors of the correct polarity could also be employed. The noninverting amplifier xn would normally be a unity gain amplifier, but amplifiers having other than unity gain could be used.

Referring now to FIG. 9, current mirror 2 would normally provide gain such that current ratio ic/ib is greater than or equal to 1. This is desirable in order that the slew rate at the collector node of transistor Qs will be greater than the slew rate capability of node y. The advantage of the circuit of FIG. 9 over that of FIG. 8 is that for the DC condition wherein ic=Is, the slew rate of the circuit of FIG. 9 will be higher because the magnitude of current ic will vary in phase with the collector current of transistor Qs for a change in input voltage vni while Is will remain constant.

A characteristic of the amplifier circuits of FIGS. 8 and 9 is that the base current of transistor Qs is not cancelled, and the resulting inverting input bias current will cause an offset voltage at the output vo. The circuit of FIG. 10 can be used as a replacement for current mirror 1 and transistor Qs in FIGS. 8 or 9 to reduce the inverting input bias current. Transistors Qma and Qmb form a simple current mirror, and the base current ibsb of cascode transistor Qsb is subtracted from current ix, so the collector current of transistor Qmb is given by ix−ibsb. Ignoring the transient current flowing through capacitance cc and summing the other currents at the base node of transistor Qsa, iy=ix−ibsb+ibsa, where ibsa is the base current of transistor Qsa. A first order approximation gives ibsb=ibsa, since nearly identical emitter currents flow in transistors Qsa and Qsb, so iy=ix and the net input bias current at node y is zero. In practice, the emitter currents, the current gain of the two transistors, and the collector-base voltage of the two transistors will not be identical so the inverting input bias current will be much smaller than before, but it will be non-zero. The circuit illustrated in FIG. 7 also exhibits low input bias current.

The circuit of FIG. 11 also offers input bias current reduction. Transistors Qs and Qsm form a current mirror which supplies current to the differential transistor pair Qta and Qtb. Other methods of supplying a current bias means for the differential pair of transistors Qta and Qtb would also work as well. The PNP current mirror should have a gain of 1 in order to insure that the stable operating point of the differential transistor pair is reached when the collector current of each transistor is equal. Also, because the collector-emitter voltage of both transistors is relatively large over most of the output voltage range, beta of each transistor will not be strongly affected by Early voltage. These two conditions in addition to good initial matching of the transistors assure well matched base currents, which leads to low input bias current at node y. The circuit of FIG. 11 represents one implementation of the current-to-voltage gain stage comprising amplifier A(s) and resistances Rx and Ry of FIG. 7.

An additional feature of all of the illustrated embodiments of the present invention is that the compensation terminal designated node x can also be used to receive a current input signal. The output voltage vo arising from a current i into node x is identical in magnitude and phase to the voltage vo arising from a current i flowing out of node y. The action of negative feedback will seek to cause the current iy to equal the current ix, scaled by the relevant factors Rx/Ry or the gain of current mirror 1, so ix is the independent variable. A voltage source connected to node x through a resistor can also be used to supply the current input signal referred to above, but because node x lies outside of the negative feedback path of resistance Rf in general or of the negative feedback path of amplifier A1 in the circuits of FIGS. 3 and 4, the resulting current ix will be distorted by the nonlinear voltage-to-current conversion properties of transistor Qx.

In the illustrated embodiments of the present invention, a resistor Rg has always been shown to be connected between node y and a ground reference voltage. In this configuration, with an input signal vni at the noninverting input, the amplifier operates in a noninverting gain configuration. The grounded end of resistor Rg could be connected instead to a second voltage source (vin) for operation in the inverting gain mode. The overall gain transfer function then becomes vo=[-vni(1+Rf/Rg)−vin(Rf/Rg)]/(1+Rf/A(s)). For the case in which vni is equal to zero, the nodes x and y experience no change in voltage, so the stray impedance at either node has no effect. Therefore, compensation at node x is not needed but its presence does not detract from the desired effect.

I claim:

1. A wideband amplifier employing current feedback and stray impedance cancelling circuitry to enhance high frequency performance, the wideband amplifier comprising:

first differential gain means having a noninverting input terminal for receiving a first input voltage, said first differential gain means also having an inverting input terminal and an output terminal;

first transistor means having a first terminal connected to the output terminal of said first differential gain means, said first transistor means also having second and third terminals;

second transistor means having a first terminal connected to the output terminal of said first differential gain means, said second transistor means also having second and third terminals;

second differential gain means having a noninverting input terminal connected to the third terminal of said first transistor means, an inverting input terminal connected connected to the third terminal of said second transistor means, and an output terminal comprising an output terminal of said wideband amplifier;

first resistor means connected between the output terminal of said second differential gain means and the second terminal of said second transistor means to provide a feedback path therebetween; and second resistor means connected between the second terminal of said second transistor means and a source of a second input voltage, said second resistor means being operative for setting the voltage gain of said wideband amplifier.

2. A wideband amplifier employing current feedback and stray impedance cancelling circuitry to enhance high frequency performance, the wideband amplifier comprising:

differential gain means having a noninverting input terminal for receiving a first input voltage, said differential gain means also having an inverting input terminal and and output terminal;

first transistor means having a first terminal connected to the output terminal of said differential gain means, said first transistor means also having second and third terminals;

second transistor means having a first terminal connected to the output terminal of said differential gain means, said second transistor means also having second and third terminals;

current mirror means having an input terminal connected to the third terminal of said first transistor means, said current mirror means also having an output terminal connected to the third terminal of said second transistor means;

inverting gain means having an inverting input terminal connected to the third terminal of said second transistor means, said inverting gain means having an output terminal comprising an output terminal of said wideband amplifier;

first resistor means connected between the output terminal of said inverting gain means and the second terminal of said second transistor means to provide a feedback path therebetween; and second resistor means connected between the second terminal of said second transistor means and a source of a second input voltage, said second resistor means being operative for setting the voltage gain of said wideband amplifier.

3. A wideband amplifier employing current feedback and stray impedance cancelling circuitry to enhance high frequency performance, the wideband amplifier comprising:

first transistor means having first, second, and third terminals;

second transistor means having corresponding first, second, and third terminals;

third transistor means having corresponding first, second, and third terminals, the first terminal being connected to receive a first input voltage and the second terminal being connected to the first terminals of said first and second transistor means;

fourth transistor means having corresponding first, second, and third terminals, the second terminal being connected to the second terminal of said first transistor means;

fifth transistor means having corresponding first, second, and third terminals, the second terminal being connected to the second terminal of said second transistor means;

sixth transistor means having corresponding first, second, and third terminals, the first terminal being connected to the first terminal of said third transistor means and to receive said first input voltage and the second terminal being connected to the first terminals of said fourth and fifth transistor means;

first current bias means connected between the second terminal of said sixth transistor means and a first supply voltage;

second current bias means connected between the second terminal of said third transistor means and a second supply voltage;

differential gain means having a noninverting input terminal connected to the third terminal of said first transistor means and an inverting input terminal connected to the third terminal of said second transistor means, said differential gain means also having an output terminal comprising an output terminal of said wideband amplifier;

first resistor means connected between the output terminal of said differential gain means and the second terminal of said second transistor means to provide a feedback path therebetween; and second resistor means connected between the second terminal of said second transistor means and a source of a second input voltage, said second resistor means being operative for setting the voltage gain of said wideband amplifier.

4. A windband amplifier employing current feedback and stray impedance cancelling circuitry to enhance high frequency performance, the wideband amplifier comprising:

first transistor means having first, second, and third terminals;

second transistor means having corresponding first, second, and third terminals;

third transistor means having corresponding first, second, and third terminals, the first terminal being connected to receive a first input voltage and the second terminal being connected to the first terminals of said first and second transistor means;

fourth transistor means having corresponding first, second, and third terminals, the second terminal being connected to the second terminal of said first transistor means;

fifth transistor means having corresponding first, second, and third terminals, the second terminal being connected to the second terminal of said second transistor means;

sixth transistor means having corresponding first, second, and third terminals, the first terminal being connected to the first terminal of said third transistor means and receive said first input voltage and the second terminal being connected to the first terminals of said fourth and fifth transistor means;

first current bias means connected between the second terminal of said sixth transistor means and a first supply voltage;

second current bias means connected between the second terminal of said third transistor means and a second supply voltage;

current mirror means having an input terminal connected to the third terminal of said first transistor means and having an output terminal connected to the third terminal of said second transistor means;

inverting gain means having an inverting input terminal connected to the third terminal of said second transistor means and having an output terminal comprising an output terminal of said wideband amplifier;

first resistor means connected between the output terminal of said inverting gain means and the second terminal of said second transistor means to provide a feedback path therebetween; and second resistor means connected between the second terminal of said second transistor means and a source of a second input voltage, said second resistor means being operative for setting the voltage gain of said wideband amplifier.

5. A wideband amplifier employing current feedback and stray impedance cancelling circuitry to enhance high frequency performance, the wideband amplifier comprising:

first transistor means having first, second, and third terminals;

second transistor means having corresponding first, second, and third terminals;

third transistor means having corresponding first, second, and third terminals, the first terminal being connected to receive a first input voltage and the second terminal being connected to the first terminals of said first and second transistor means;

fourth transistor means having corresponding first, second, and third terminals, the second terminal being connected to the second terminal of said first transistor means;

fifth transistor means having corresponding first, second, and third terminals, the second terminal being connected to the second terminal of said second transistor means;

sixth transistor means having corresponding first, second, and third terminals, the first terminal being connected to the first terminal of said third transistor means and to receive said first input voltage and the second terminal being connected to the first terminals of said fourth and fifth transistor means;

first current bias means connected between the second terminal of said sixth transistor means and a first supply voltage;

second current bias means connected between the second terminal of said third transistor means and a second supply voltage;

first current mirror means having an input terminal connected to the third terminal of said first transistor means and having an output terminal connected to the third terminal of said second transistor means;

seventh transistor means having corresponding first, second, and third terminals, the first terminal being connected to the third terminal of said second transistor means;

second current mirror means having an input terminal connected to the third terminals of said fourth and fifth transistor means and having an output terminal connected to the third terminal of said seventh transistor means;

noninverting gain means having an input terminal connected to the third terminal of said seventh transistor means and having an output terminal comprising an output terminal of said wideband amplifier;

first resistor means connected between the output terminal of said noninverting gain means and the second terminal of said second transistor means to provide a feedback path therebetween; and second resistor means connected between the second terminal of said second transistor means and a source of a second input voltage, said second resistor means being operative for setting the voltage gain of said wideband amplifier.

6. A wideband amplifier employing current feedback and stray impedance cancelling circuitry to enhance high frequency performance, the wideband amplifier comprising:

first transistor means having first, second, and third terminals;

second transistor means having corresponding first, second, and third terminals;

third transistor means having corresponding first, second, and third terminals, the first terminal being connected to receive a first input voltage and the second terminal being connected to the first terminals of said first and second transistor means;

fourth transistor means having corresponding first, second, and third terminals, the second terminal being connected to the second terminal of said first transistor means;

fifth transistor means having corresponding first, second, and third terminals, the second terminal being connected to the second terminal of said second transistor means;

sixth transistor means having corresponding first, second, and third terminals, the first terminal being connected to the first terminal of said third transistor means and to receive said first input voltage and the second terminal being connected to the first terminals of said fourth and fifth transistor means;

first current bias means connected between the second terminal of said sixth transistor means and a first supply voltage;

second current bias means connected between the second terminal of said third transistor means and a second supply voltage;

first current mirror means having an input terminal connected to the third terminal of said first transistor means and having an output terminal connected to the third terminal of said second transistor means;

seventh transistor means having corresponding first, second, and third terminals, the first terminal being connected to the third terminal of said second transistor means;

second current mirror means having an input terminal connected to the third terminal of said fourth transistor means and having an output terminal connected to the third terminal of said seventh transistor means;

noninverting gain means having an input terminal connected to the third terminal of said seventh transistor means and having an output terminal comprising an output terminal of said wideband amplifier;

first resistor means connected between the output terminal of said noninverting gain means and the second terminal of said second transistor means to provide a feedback path therebetween; and second resistor means connected between the second terminal of said second transistor means and a source of a second input voltage, said second resistor means being operative for setting the voltage gain of said wideband amplifier.

7. A feedback amplifier comprising:

input buffer amplifier means having an input terminal for receiving a first input signal and having first and second buffer output terminals, said input buffer amplifier means being operative for controlling a voltage signal at the first buffer output terminal in common with a voltage signal at the second buffer output terminal and for providing a buffer output voltage signal that is common to both of said first and second buffer output terminals, said input buffer amplifier means being further operative for controlling the buffer output voltage signal in accordance with the first input signal, while allowing currents to flow independently of each other to or from said first and second buffer output terminals, said input buffer amplifier means being further operative for providing a current sense signal that is responsive to the algebraic difference between the currents flowing to or from said first and second buffer output terminals;

output amplifier means having an output comprising an output terminal of said feedback amplifer for controlling a voltage signal at said output terminal in accordance with said current sense signal while allowing a current to flow to or from said output terminal;

current feedback means connected between said output terminal and said first buffer output terminal for causing a current to flow into said first buffer output terminal that is responsive to the algebraic difference between the voltage signal at said output terminal and the buffer output voltage signal; and gain setting means connected between a source of a second input signal and said first buffer output terminal for causing an additional current to flow into said first buffer output terminal, said additional current being responsive to the algebraic difference between said second input signal and said buffer output voltage signal.

8. A feedback amplifier as in claim 7 further comprising first and second current sense terminals and wherein:

said input buffer amplifier means and said output amplifier means are coupled to said first and second current sense terminals;

said input buffer amplifier means is further operative for controlling first and second sense currents flowing into said first and second current sense terminals such that the algebraic difference between said first and second sense currents is responsive to the algebraic difference between said currents flowing independently of each other to and from said first and second buffer output terminals; and said current sense signal is equal to the algebraic difference between said first and second sense currents flowing into said first and second current sense terminals.

* * * * *